United States Patent [19]
Paton

[11] Patent Number: 5,512,796
[45] Date of Patent: Apr. 30, 1996

[54] LAMINATE FOR USE IN MANUFACTURE OF INK JET PRINTHEADS

[75] Inventor: Anthony D. Paton, Cambridge, England

[73] Assignee: Xaar Limited, Cambridge, United Kingdom

[21] Appl. No.: 66,089

[22] PCT Filed: Nov. 27, 1991

[86] PCT No.: PCT/GB91/02093

§ 371 Date: May 27, 1993

§ 102(e) Date: May 27, 1993

[87] PCT Pub. No.: WO92/09436

PCT Pub. Date: Jun. 11, 1992

[30]     Foreign Application Priority Data

Nov. 27, 1990 [GB] United Kingdom ............... 9025706

[51] Int. Cl.$^6$ ................................................. H01L 41/08
[52] U.S. Cl. ..................... 310/358; 310/328; 310/359; 310/364; 347/68; 29/25.35
[58] Field of Search ....................... 310/328, 333, 310/359–359, 311, 364, 365; 361/233; 264/23, 24; 346/140 R, 75, 1.1; 29/25.35; 347/68–72

[56]            References Cited

U.S. PATENT DOCUMENTS

| | | | |
|---|---|---|---|
| 4,879,568 | 11/1989 | Bartky et al. ............... | 347/69 |
| 4,887,100 | 12/1989 | Michaelis et al. ........... | 310/333 X |
| 5,016,028 | 5/1991 | Temple ..................... | 346/140 R |
| 5,036,241 | 7/1991 | Michaelis et al. ........... | 310/358 |
| 5,086,308 | 2/1992 | Takahashi et al. ........... | 347/72 |

FOREIGN PATENT DOCUMENTS

| | | |
|---|---|---|
| 277703A1 | 8/1988 | European Pat. Off. . |
| 278590A1 | 8/1988 | European Pat. Off. . |
| 309147A2 | 3/1989 | European Pat. Off. . |
| 326973A2 | 8/1989 | European Pat. Off. . |

OTHER PUBLICATIONS

Patent Abstracts of Japan, vol. 10, No. 293 (E–443) (2349) Oct. 4, 1986.
Patent Abstracts of Japan, vol. 12, No. 287 (E643) (3134) Aug. 5, 1988.
Patent Abstracts of Japan, vol. 15, No. 333 (M–1150) (4861) Aug. 23, 1991.
Patent Abstracts of Japan, vol. 15, No. 365 (EE1111) (4893) Sep. 13, 1991.

*Primary Examiner*—Mark O. Budd
*Attorney, Agent, or Firm*—Marshall, O'Toole, Gerstein, Murray & Borun

[57]                ABSTRACT

A co-fired laminate (10) for use in printheads for drop-on-demand ink jet printers has two inner layers (12, 14) of piezoelectric material which are thickness poled in opposite senses, two outer layers (11, 15) of inactive material and a fifth layer (13) disposed between the inner layers which is electrically insulating under the printhead operating conditions and conductive under the poling conditions of the inner layers. The fifth layer preferably is an N.T.C. material with its critical temperature between the operating and poling temperatures. After poling of the inner layers further manufacture of the printhead from one side thereof can be effected as described.

26 Claims, 4 Drawing Sheets

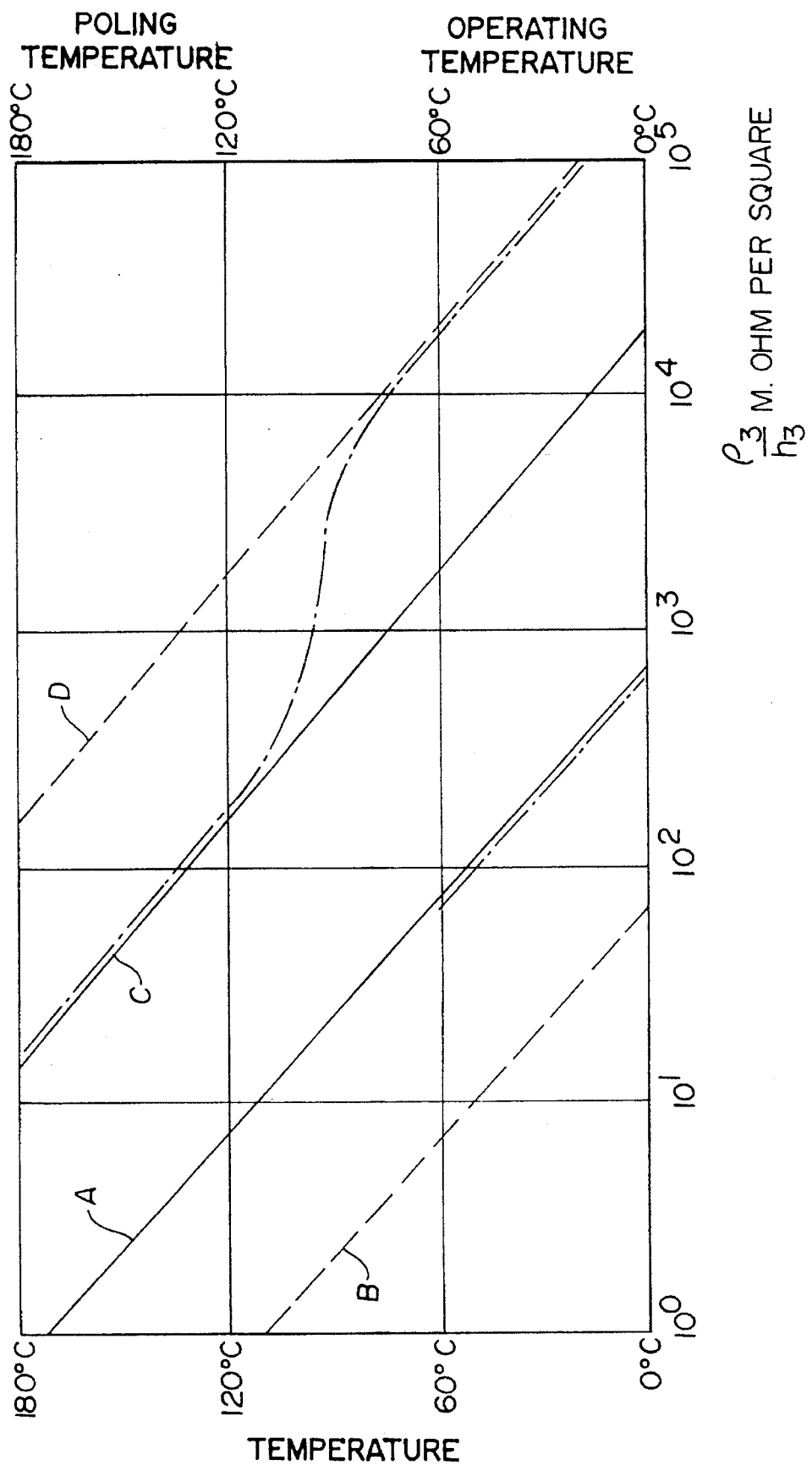

LAMINATE FOR USE IN MANUFACTURE OF INK JET PRINTHEADS

This invention relates to a laminate fop use in the manufacture of printheads for drop-on-demand ink jet printing.

In European Patent No. 0278590 there is described with reference to FIGS. 2(a) and 2(b) a printhead structure of the so-called "chevron" type. This is an advantageous form of structure as it requires a relatively low operating voltage. Further, U.S. Pat. No. 5,016,028 discloses an array printhead of the so-called "cantilever" type which requires a Relatively high operating voltage, in which manufacture takes place from one side of the printhead.

One object of the present invention is to provide a laminate for use in manufacture of an array printhead of the chevron type so that manufacture thereof can take place from one side of the array.

The present invention consists in a co-fired laminate for use in the manufacture of printheads for drop-on-demand ink jet printers, comprising two inner layers of piezo-electric ceramic material which are thickness poled in opposite senses and two outer layers of inactive ceramic material, characterised in that between said inner layers is provided a fifth layer of ceramic material which in response to actuating pulses at the operating temperature of the printhead is substantially insulating and at the poling temperature of the inner layers is substantially conductive duping the poling period.

Suitably, the resistance of said fifth layer lies in a range of approximately 1.5 orders of magnitude. Preferably, the resistance of the fifth layer lies between 75 M.ohms/square and 2500 M.ohms/square at 60° C.

In one form of the invention said fifth layer is a negative temperature coefficient (NTC) ceramic material having a critical temperature between the operating and poling temperatures at which the resistance of said material changes rapidly.

In a further form of the invention said outer layers are formed of an insulating ceramic. Said ceramic suitably is a glass ceramic and may be formed with a dopant to increase the conductivity thereof at the poling temperature.

The invention further consists in the method of forming a drop-on-demand ink jet array printhead comprising
 (a) forming a co-fired laminate having two inner layers of piezo-electric material, two outer layers of inactive ceramic material and a fifth layer of ceramic material between said inner layers which is insulating in response to actuating pulses at the operating temperature and at the poling temperature is conductive duping the poling period;
 (b) applying electrodes to outer surfaces respectively of said two outer layers;
 (c) applying a poling pulse between said fifth layer and said electrodes thereby to effect thickness poling of the inner layers in respective opposite senses;
 (d) removing one of the outer layers;
 (e) forming an array of parallel channels of depth which extends normal to the laminate through the inner layer from which said one of the outer layers was removed, the middle layer and a substantial part at least of the other of said inner layers; and
 (f) applying electrode layers to facing sides of each of said channels.

The invention will now be described, by way of example, with reference to the accompanying drawings, in which:

FIG. 1 is a cross-sectional view of a laminate according to the invention;

FIG. 2(a) and 2(b) are cross-sectional views of the laminate of FIG. 1 in the course of conversion thereof to an ink jet array printhead component;

FIG. 4 is a diagram similar to that of FIG. 3 showing the variation of electrical resistance per square against temperature of the central layer of the laminate when the central layer comprises a negative temperature coefficient material.

Figure 1:
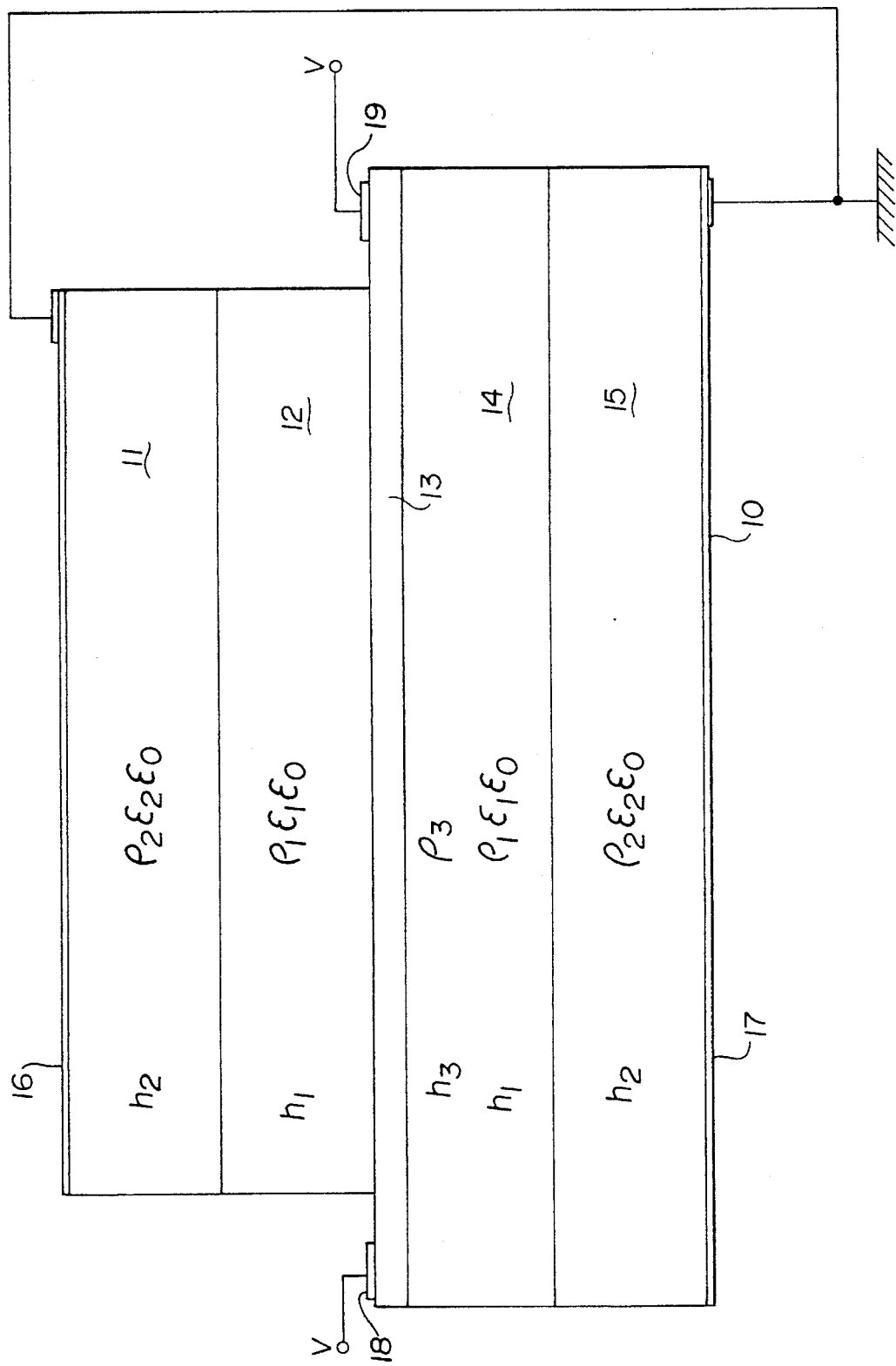

Referring first to FIG. 1, a laminate 10 comprises five layers 11 to 15 each of which is a retro-electric ceramic. Suitably, each of the layers is tape-cast in the form of longitudinal strips pressed onto one another and co-fired.

Outer layers 11 and 15 of the laminate are of inactive materials suitable for being co-fired with inner layers 12 and 14 of piezo-electric ceramic made of lead zirconium titanate (PZT). The preferred materials for the inner layers are a polycrystalline PZT having superior piezo-electric activity defined by the property $(d_{15}/\sqrt{s^{D}_{55}})$ such as is obtained from Motorola D3203 or Tokin N-8, N-10 or N-20. These are commercially available materials having high shear mode activity.

The outer layers 11 and 15 may also be of piezo-electric ceramic with thermal expansion characteristics matched to those of the inner layers and having similar or the same basic mix as is used for the inner layers but also including a dopant to render the ceramic inactive or depoled when subject to an electric field. An example of a suitable dopant is lanthanum (La) or Strontium (St). The addition or substitution of Lanthanum for example is known to depress the Curie temperature of the material. By the addition of 5–10% of such dopants the material of the outer layers is readily depoled by raising the temperature of the laminate to their Curie temperature, while the material of the inner layers remains polarized. With addition of sufficient dopant, the Curie temperature can be depressed below the poling temperature and in this case the outer levers will never become poled. The laminate is symmetrical, so that is not liable to distort under poling or depoling stresses and such stresses rapidly decay by creep. A satisfactory effect as regards rendering the outer levers inactive or depoled when subject to an electric field may be obtained with concentrations of dopant in the range 2 to The central layer 13 is a thin layer of doped ceramic, which may be applied optionally in tape cast form, or as a slurry which is coated on one of the facing surfaces of layers 12 and 14.

The laminate is subsequently fired and poled as described below. Channels are then cut through layers 12, 13 and 14 and operating electrodes deposited onto channel separating side walls as are shown in FIG. 2 and described hereinbelow in the detailed discussion of manufacture of the printhead.

Layer 13 is effectively insulating in response to the operating waveform, typically pulses of 10μ seconds duration, at the operating temperature (0°–60° C.) of the ink jet printhead but is substantially conducting on application of the poling .voltage pulse, typically of 10 seconds duration, et the poling temperature. It is a preferred aspect of this lever that it is characterized by a temperature coefficient of resistance of negative slope, so that its conductivity increases as temperature increases. This is characteristic of ceramic materials and thermistors, but is the opposite of the characteristic of metallic conductors whose resistance increases with temperature.

Figure 2A:
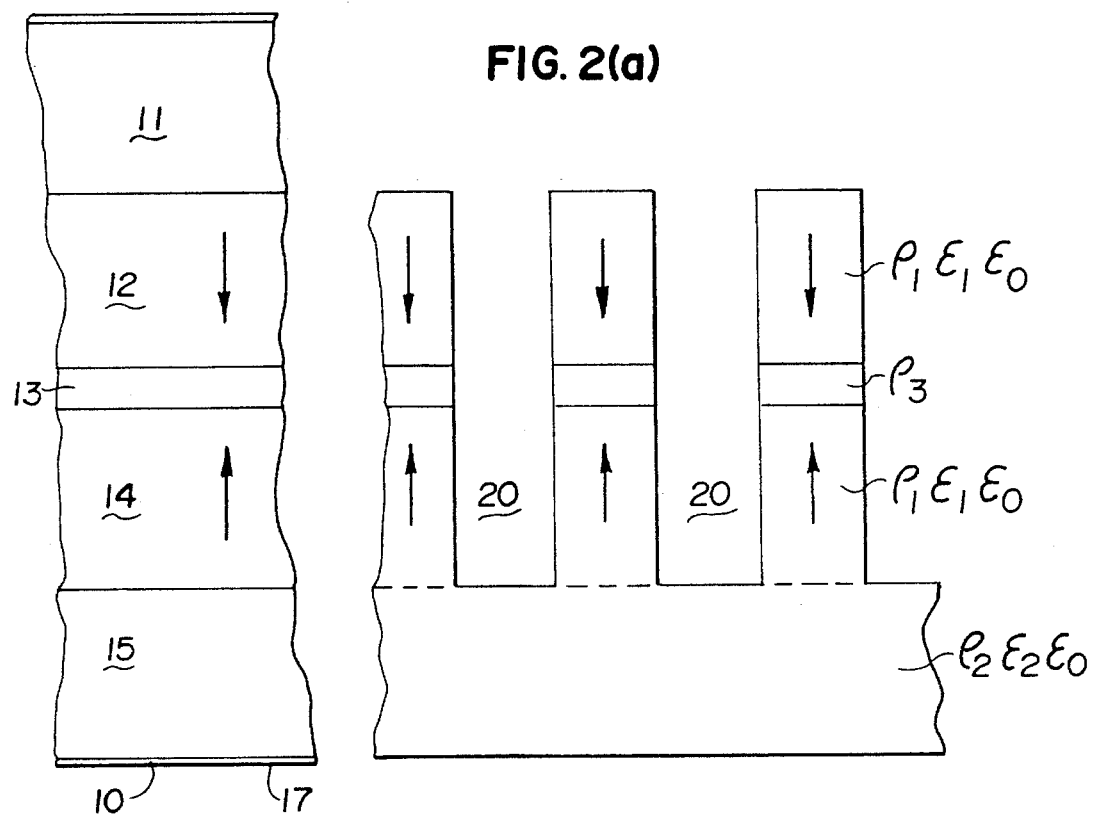
Figure 2B:
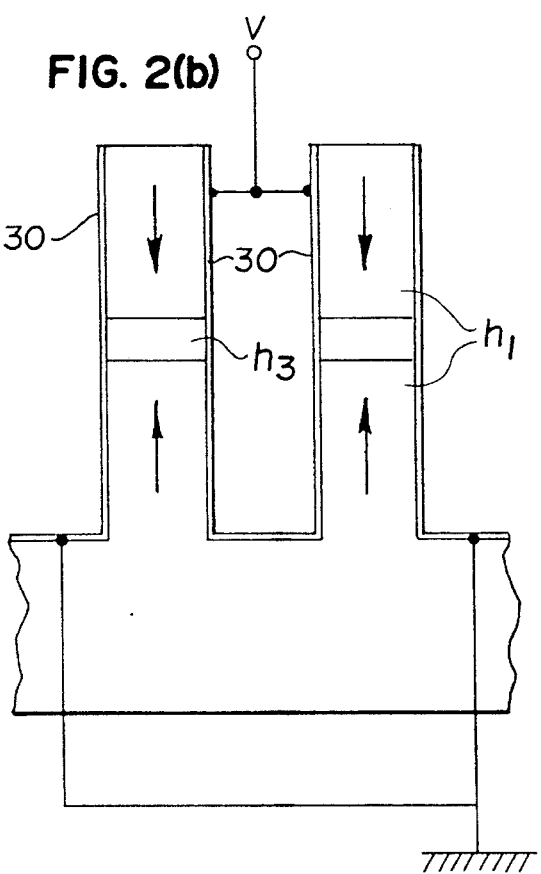
Figure 3:
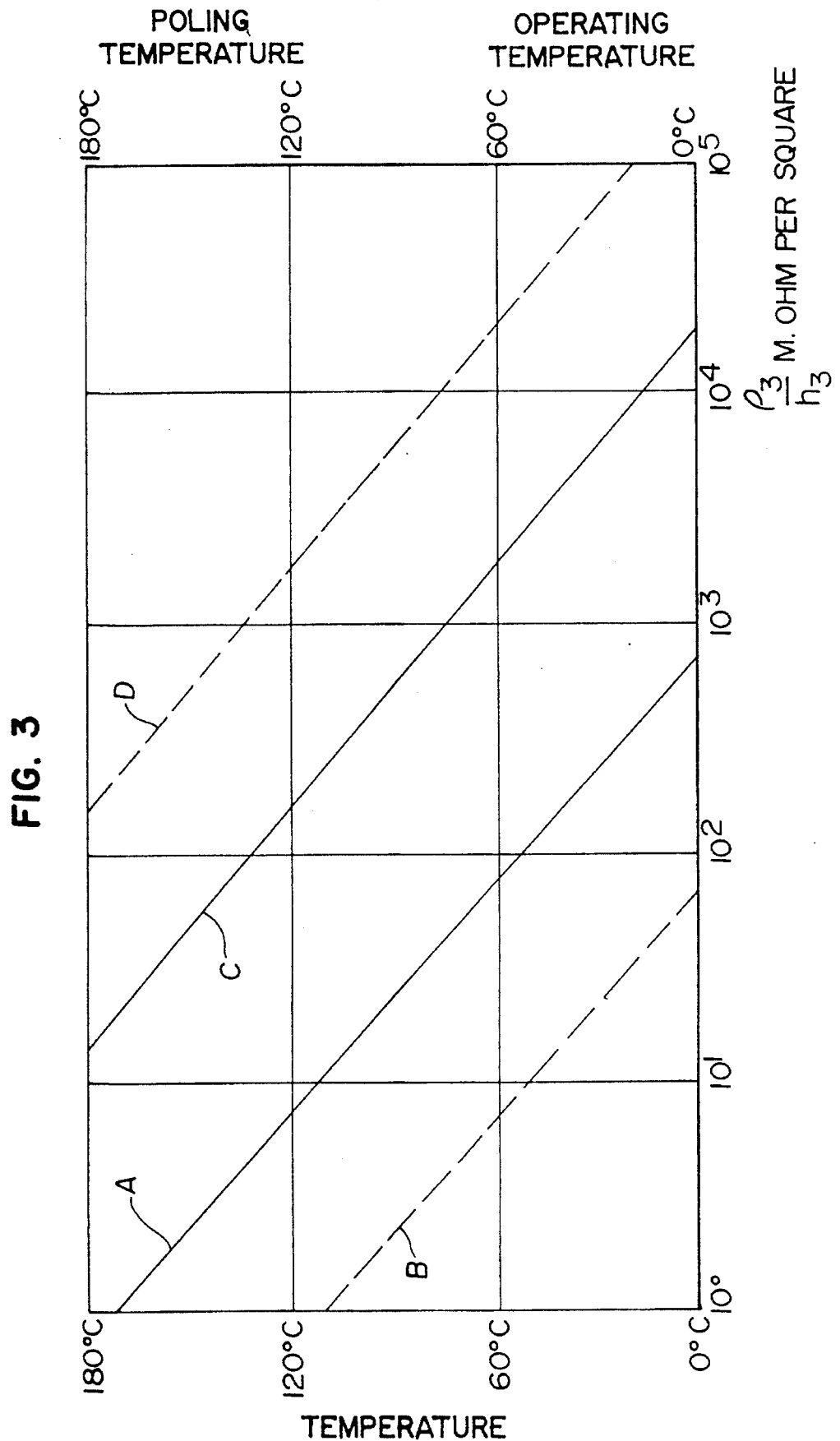
FIG. 3 is a diagram of electrical resistance per square of the central layer of the laminate of the earlier Figures against temperature. It illustrates the trend of the minimum resistance appropriate for shear mode wall actuation of a chevron-type of channel wall actuator at room temperature and the trend of the maximum resistance suitable for poling the laminate at the poling temperature.

The condition that the layer 13 is effectively insulating in response to the operating waveform at the operating temperature applied to the electrodes of an actuator is quantified by reference to FIG. 2 and illustrated in FIG. 3. If the period of the waveform is 10 μsec and the charge leakage through the layer 13 in the actuator is limited to 1%

$$\frac{2h_1}{h_3} \rho_3 \epsilon_1 \epsilon_o > \frac{10^{-5}}{10^{-2}} = 10^{-3}$$

where $h_1$ is the thickness of each layer 12 or 14

$h_3$ is the thickness of layer 13

$\epsilon_1$ and $\epsilon_2$ are respectively the relative permittivity of each layer 12 and 14 and of free space, and $\rho_3$ is the resistivity of layer 13.

and, if $h_1=250\times10^{-6}$ m $\epsilon_1=3000$ $\epsilon_o=8.85\times10^{-12}$ F.m$^{-1}$ the layer resistance per square $$\frac{\rho_3}{h_3} > \frac{10^6 \cdot 10^{-3}}{2 \times 250 \times 3000 \times 8.85 \times 10^{-12}} = 76 \text{ M} \cdot \text{ohm per square}$$

The condition that the layer 13 is substantially conducting on application of the poling voltage pulse can also be quantified. The poling voltage as illustrated in FIG. 1 is applied to electrodes 18 and 19 on each side of the strip at the poling temperature, typically 120° C. Charge then flows inward through the layer 13, so that the differential voltage between the layer 13 and the electrodes 16 and 17 becomes progressively uniform. Typically, it is required to attain 99% uniformity between the voltage at the outer edges and that at the centre of the strip within a poling pulse period of 10 secs.

Analysis shows that the voltage distribution is expressed by a simple diffusion equation of the form $$\frac{\partial^2 V}{\partial \chi^2} = \left[ \frac{\epsilon_o}{\frac{h_1}{\epsilon_1} + \frac{h_2}{\epsilon_2}} \cdot \frac{3}{} \right] \cdot \frac{\partial V}{\partial t}$$

and that 99% uniformity is attained when $$\frac{\rho_3}{h_3} \leq \frac{\left( \frac{h_1}{\epsilon_1} + \frac{h_2}{\epsilon_2} \right)}{2\epsilon_o \, (l/2)^2} \cdot t$$

where $l/2 = \chi$ and if $$\frac{h_1}{\epsilon_1} = \frac{h_2}{\epsilon_2} = \frac{250 \times 10^{-6} \text{ m}}{3000}$$

$\epsilon_o = 8.85 \times 10^{-12}$ F · m$^{-1}$ $t = 10$ sec   $l = 40$ mm where $h_1=h_2$ is the thickness of each layer 11 and 15

V is the poling voltage l is the distance between the electrodes 18 and 19 t is time for the voltage in the layer 13 to become 99 percent uniform and is ≦ the poling time.

$$\frac{\rho_3}{h_3} < \frac{10 \times 2 \times 250 \times 10^{-6}}{3000 \times 2 \times 8.85 \times 10^{-12} \times 400 \times 10^{-6}}$$

-continued $$\frac{\rho_3}{h_3} < 220 \text{ M} \cdot \text{ohm per square}$$

The conditions that $\rho_3/h_3$ which is the resistance per square of the layer 13>76 M.ohm at the operating temperature of 60° C. and that $\rho_3/h_3$ 220 M.ohm at poling temperatures of 120° C. and 180° C. are illustrated as lines marked C and D in FIG. 3. Measured at 60° C., this range is between 76 and 2500 M.ohm pep square.

In FIG. 3, the resistance $\rho_3/h_3$ per square is plotted over five decades from $\rho_3/h_3=1-10^5$ M.ohm, over a temperature range 0°–180° C.

The resistance of ceramics is characterized by a temperature coefficient or negative slope and or magnitude such that the resistance typically rails by an order of magnitude for every increase in temperature or 60° C.

The line A indicates the course or the resistance per square $\rho_3/h_3$ of layer 13, such that at 60° C. its resistance per square=76 M.ohm. In that case 1% of the charge stored at 60° C. is discharged during the operating cycle. The line B indicates a lower resistance per square when 10% or the charge stored at 60° C. is discharged during the operating cycle. For practical operation the resistance per square or layer 13 should be to the right of line A.

Similarly the line C is such that the resistance per square is 220 M.ohm at 120° C. In that case the poling field is 99% uniform after application for 10 seconds. The lane D indicates the resistance per square for a material poled with similar uniformity at 180° C. In practice the material selected should be to the left of line C.

The material of layer 13 should thus be selected to have a resistance per square in the range between lines A and C i.e. within a resistance range of about 1.5 orders of magnitude, this range being obtained by reading the separation of the lines A and C at the same temperature.

These calculations indicate that a resistance per square $\rho_3/h_3$ of layer 13 can be obtained such that it is effectively insulating in response to the operating waveform (10 μsec) at the operating temperature (0°–60° C.) of the ink jet printhead, but is substantially conducting on application of the poling waveform at the poling temperature (of 120°–180° C.) for a duration of 10 seconds.

The material of layer 13 may however be a material comprising an NTC (negative temperature coefficient) ceramic. NTC ceramics are materials having a non-linear variation of resistivity, such that their resistance undergoes a step reduction within a narrow temperature range. Normally this step change of resistivity is limited to 1–2 orders of magnitude concentrated over 5°–10° C. range. If this critical temperature is chosen to be above the operating temperature and below the poling temperature, the margin of resistance per square is further increased above that indicated in FIG. 3 for a ceramic insulator.

This is illustrated in FIG. 4 where the chain dotted lines A' and C' show the corresponding limiting valves of resistance per square with temperature under operating and poling conditions respectively for an NTC ceramic. The effective temperatures are the operating and poling temperatures, typically 60° C. and 120° C., and the resistance per square range is now around 2.5 orders of magnitude, this range being that between the locations at which the lines A' and C' intersect either of the said typical operating and poling temperatures. This range affords increased margin in the choice of resistivity per square of the layer 13.

The outer layer 11 and 15 in an alternative form of the invention may be an insulating ceramic, such as a glass ceramic, chosen to have a thermal expansion coefficient matched to that of the layers 12, 13 and 14. Examples of such a material are Cordierite and oxides of Lithium Aluminium and Silicon which are glass ceramics whose expansion coefficient can be selected according to ingredients and thermal history to lie in the range of $1-4\times10^{-6}$ per °C. Such a material can be co-fired with the piezo-electric layers 12–14 and has the advantage that its modulus of elasticity is greater than the materials described above, which were La or Si doped PZT.

The dielectric constant of a glass ceramic such as cordierite is usually 8–12 and is thus substantially lower than that of layers 12 and 14 where $\epsilon_1$ is typically 3000. As will be evident later the poling voltage to pole layers 12 and 14 through layers 11 and 15 respectively is made substantially more difficult due to its lower dielectric constant. Consequently, the resistivity of the outer layers 11 and 15 if they consist of glass ceramic is reduced by the addition of dopants.

Typically, the resistivity $\rho_2$ of layers 11 and 15 is reduced so that $$\rho_2 < \frac{h_1}{h_2} \cdot \frac{t}{\epsilon_1 \epsilon_o}$$

and if $$\epsilon_1 = 3000 \quad \epsilon_o = 8.85 \times 10^{-12} \text{ F} \cdot \text{m}^{-1}$$

and $$t = 10 \text{ secs} \quad h_1 = h_2$$

$$\rho_2 < 3.8 \times 10^8 \text{ ohm} \cdot \text{m}$$

then the voltage applied to the outer electrodes 16 and 17 penetrates layers 11 and 15 respectively during the 10 second period of the poling pulse, and a high proportion of the voltage is effective over the piezo-electric layers 12 and 14 because charge penetrates the layers 11 and 15 by conduction so that the voltages at the interfaces of the layers 14 and 15 and the levers 11 and 12 tend to become equal to the voltage of the electrodes 16 and 17 respectively.

Thus layers 11 and 15 may optionally be made of an insulating ceramic, providing its resistivity is suitably reduced at the poling temperature. This aspect was disclosed in U.S. Pat. No. 5,036,241.

The laminate 10 may be made as previously stated from five layers of ceramic of suitable materials that are tape cast, pressed together and co-fired, the fifth being optionally applied as a slurry to one of the facing surfaces of the liner layers 12 and 14. The laminate includes outer electrodes 16 and 17 and central electrodes 18 and 19 formed on either side of layer 13. During firing, due to the symmetry of the laminate, the ceramic remains substantially flat.

The laminate is poled by application of a poling field, as illustrated, between electrodes 16, 17 and 18, 19. This applies a poling field to polarize the piezo-electric material of layers 12 and 14 in a configuration denoted by arrows indicated in FIG. 2. If layers 11 and 15 comprise a piezo-electric material, and they become polarized during the poling step, they are readily depoled by heating them above their Curie temperature during or after poling: if those layers are an insulating ceramic which is non piezo-electric, an enhanced conductivity in those layers helps to limit the magnitude of the poling field. After poling, the materials are aged to allow residual stresses to relax by creep. Normal activity tests of the piezo-electric structure can be performed to monitor the material characteristics.

The construction of an ink jet printhead component from the laminate is illustrated by reference to FIGS. 2(a) and (b) in which the five layers are shown diagrammatically on the left. Initially the layer 11 and its electrode 16 are removed by grinding or lapping and the lower electrode 17 is removed by lapping or etching leaving the face so exposed of layer 12 and layer 15 parallel and the surface of the layer 12 flat to a high tolerance.

Ink channels 20 are then cut in the laminate as illustrated in the central section. The method of forming channels has previously been disclosed in U.S. Pat. No. 5,016,028 which relates to an ink Jet array printhead which can be manufactured from one side of the channel structure. However, because the layers 12 and 14 are oppositely poled the wall actuators will now be of the so called "chevron" type, such as are the subject of European Patents No. 0277703 and No. 0278590. These actuators are known to be advantageous because they require a lower actuating voltage to establish the same pressure in the ink channels during operation. If the insulating glass ceramic is used in the layer 15 this serves to stiffen the wall actuators at their root interface with layer 15, which also serves to limit the compliance of the wall actuator.

After forming channels as illustrated in FIG. 2(b) the wall actuators are plated with electrodes 30 as illustrated in the right hand section to which a passivation coating may be applied. Subsequent operations to build an ink Jet array printhead are known in the art.

I claim:

1. A co-fired laminate for use in the manufacture of printheads for drop-on-demand ink jet printers, comprising two inner layers of piezo-electric material and two outer layers of inactive ceramic material, characterized in that between said inner layers is provided a fifth layer of ceramic material which in response to actuating pulses at the operating temperature of the printhead is insulating and at the poling temperature of the inner layers is conductive during the poling period.

2. A laminate is claimed in claim 1, characterised in that the resistance pep square of said fifth layer lies in a range of approximately 1.5 orders of magnitude measured at the operating or poling temperature.

3. A laminate as claimed in claim 2, characterised in that the resistance of the fifth layer lies between 75M and 2500 M.ohms. per square at 60° C.

4. A laminate as claimed in claim 1, characterised in that said fifth layer is a negative temperature coefficient (NTC) ceramic material having a critical temperature between the operating and poling temperatures at which the resistance of said material changes rapidly.

5. A laminate as claimed in claim 4, characterised in that said fifth layer has a resistivity and a thickness providing between the operating and poling temperatures a resistance per square range greater than 2.5 orders of magnitude.

6. A laminate as claimed in claim 1, characterised in that said outer layers are formed of an insulating ceramic.

7. A laminate as claimed in claim 6, characterised in that said outer layers are formed of a glass ceramic.

8. A laminate as claimed in claim 7, characterised in that said outer layers are formed of a glass ceramic of oxides of Lithium, Aluminium and silicon.

9. A laminate as claimed in claim 7, characterised in that said outer layers are formed with a dopant to render them more conductive at the poling temperature.

10. A laminate as claimed in claim 1, characterised in that said outer layers are each formed of piezo-electric ceramic material including a dopant to render the layer inactive or depoled when subject to an electric field.

11. A laminate as claimed in claim 10, characterized in that said dopant is selected from the group consisting of Lanthanum and Strontium.

12. A laminate as claimed in claim 11, characterised in that said dopant is contained in the material of said outer layers in a concentration of 2 to 25 per cent.

13. A laminate as claimed in claim 1, characterised by an array of parallel channels formed in the laminate after removing part at least of one outer layer, said channels extending normal to and penetrating the inner layers and the fifth layer.

14. A laminate as claimed in claim 13, characterised in that channel facing surfaces of inter channel walls formed by three of the laminate layers are coated with conductive electrode layers.

15. A laminate as claimed in claim 14, characterised in that said electrode layers are provided with a passivation coating.

16. A laminate as claimed in claim 1, wherein the two inner layers of piezo-electric ceramic material are thickness poled in opposite senses.

17. A method of poling a laminate as claimed in claim 1, comprising the steps of applying electrodes to outer surfaces respectively of said outer layers and applying a poling pulse between said fifth layer and said electrodes thereby to effect a thickness poling of the inner layers in respective opposite senses.

18. A co-fired laminate for use in the manufacture of printheads, comprising first and second layers of piezoelectric ceramic material which are thickness poled in opposite senses and an intermediate layer of ceramic material between said first and second layers of piezoelectric ceramic material, said ceramic material of the intermediate layer being insulating in response to actuating pulses at the operating temperature of the printhead and being conductive at the poling temperature of the first and second layers of piezoelectric ceramic material during the poling period.

19. A laminate according to claim 18, further comprising a co-fired substrate layer of inactive ceramic material beneath said first layer of piezoelectric ceramic material.

20. A laminate according to claim 19, further comprising a co-fired, removable top layer of inactive ceramic material above said second layer of piezoelectric ceramic material.

21. A laminate according to claim 18, comprising an array of parallel channels extending normal to and penetrating said first and second layers of piezoelectric ceramic material and said intermediate layer of ceramic material.

22. A laminate according to claim 18, wherein said first layer has a thickness $h_1$ and a relative permittivity $\epsilon_1$, wherein said intermediate layer has a thickness $h_3$ and wherein the ceramic material of the intermediate layer has a resistivity at the operating temperature which is not less than $\rho_{operating}$ where $$\rho_{operating} = \frac{h_3}{2h_1\epsilon_1\epsilon_0} \times 10^{-3}$$

$\epsilon_0$ being the relative permittivity of free space.

23. A laminate according to claim 22, wherein the ceramic material of the intermediate layer has a resistivity at 60° C. which is not less than $\rho_{operating}$.

24. A laminate according to claim 22, wherein said intermediate layer has a length l and wherein the ceramic material of the intermediate layer has a resistivity at the poling temperature of not greater than $\rho_{poling}$ where $$\rho_{poling} = \frac{4h_1h_3}{\epsilon_1\epsilon_0 l^2} \times 10.$$

25. A laminate according to claim 24, wherein the ceramic material of the intermediate layer has a resistivity at 180° C. of not greater than $\rho_{poling}$.

26. A laminate according to claim 25, wherein the ceramic material of the intermediate layer has a resistivity at 120° C. of not greater than $\rho_{poling}$.

* * * * *